United States Patent
Tsuruno et al.

(10) Patent No.: US 6,969,829 B2
(45) Date of Patent: Nov. 29, 2005

(54) SUBSTRATE PROCESSING APPARATUS

(75) Inventors: Masaaki Tsuruno, Kikuchi-Gun (JP); Yoichi Deguchi, Tokyo-To (JP)

(73) Assignee: Tokyo Electron Limited, Tokyo-To (JP)

(*) Notice: Subject to any disclaimer, the term of this patent is extended or adjusted under 35 U.S.C. 154(b) by 459 days.

(21) Appl. No.: 10/080,581

(22) Filed: Feb. 25, 2002

(65) Prior Publication Data
US 2002/0117113 A1 Aug. 29, 2002

(30) Foreign Application Priority Data
Feb. 27, 2001 (JP) .............................. 2001-052799

(51) Int. Cl.[7] .............................................. F27B 5/14
(52) U.S. Cl. ...................... 219/390; 219/405; 219/411; 392/416; 392/418; 118/724; 118/725; 118/50.1
(58) Field of Search ................................. 219/390, 405, 219/411; 392/416, 418; 118/724, 725, 50.1

(56) References Cited

U.S. PATENT DOCUMENTS 4,693,211 A * 9/1987 Ogami et al. ............... 118/725
6,190,459 B1 2/2001 Takeshita et al.
6,246,030 B1 6/2001 Matsuyama
6,419,751 B1 * 7/2002 Nagashima ................. 118/715
6,461,439 B1 * 10/2002 Granneman et al. ........ 118/724

* cited by examiner

Primary Examiner—Shawntina Fuqua
(74) Attorney, Agent, or Firm—Oblon, Spivak, McClelland, Maier & Neustadt, P.C.

(57) ABSTRACT

A substrate processing apparatus including lift pins for lifting the substrate capable of moving up and down, a heating plate with holes through which the lift pins protrude and sink to a surface facing the substrate, a lid placed above the heating plate capable of moving up and down, a first inert gas introducing mechanism introducing a first inert gas to the inside portion of the lid and a second inert gas introducing mechanism introducing a second inert gas onto the surface of the heating plate through the holes. With such configuration, the inert gas can be introduced to both sides, the front side and the rear side, of the substrate, and oxygen is prevented from being forced to come around to the surface of the substrate from the rear side thereof. As a result, oxidation of the substrate can be prevented effectively.

22 Claims, 14 Drawing Sheets

SUBSTRATE PROCESSING APPARATUS

BACKGROUND OF THE INVENTION

1. Field of the Invention

The present invention belongs to a technical field of manufacturing process of a semiconductor device, especially relating to a substrate processing apparatus performing a heating process onto a material used for forming an insulation film coated on the surface of a semiconductor wafer.

2. Description of the Related Art

In a manufacturing step in a process of a semiconductor device, for example, SOD (Spin on Dielectric) system is used for forming an inter-layer insulation film. In the SOD system, a coating film is spin-coated on a wafer with using sol-gel method and the like and an inter-layer insulation film is formed with performing processes like a chemical process or a heating process on the wafer.

For example, in a case of forming an inter-layer insulation film with sol-gel method, first of all, a material used for forming an insulation film, for example, a solution in which colloid of TEOS (Tetra-Ethyl-Orso-Silicate) is dispersed into an organic solvent is supplied on the semiconductor wafer (hereinafter referred to as a "wafer"). Next a gelling process is performed on the wafer on which the solution is supplied and subsequently solvent is being substituted. Then the heating process is performed on the wafer which solvent is being substituted, followed by a cooling process.

A series of steps such as applying an isolation film material, performing a gelling process, the heating and the cooling process, is done in a single processing system including a transfer mechanism transferring the substrate to each of the processing apparatuses.

Incidentally, in a step of heating process, for example, the heating process is being performed in a state of reduced pressure in the hermetically sealed chamber. Alternatively, the heating process is also being performed with decreased oxygen density in the chamber by introducing nitrogen as an inert gas thereto in order to prevent oxidation of the substrate.

However, especially when transferring the substrate into the chamber with the transfer mechanism, the substrate may be oxidized for it more or less has a moment of being exposed to oxygen. In addition, the turbulence in a flow of the inert gas when transferring the substrate in and out of the chamber may have a bad effect on the coated film.

In addition, a conventional method of introducing nitrogen to inside the chamber is generally aimed at the surface of the substrate, and there is a case that the nitrogen does not reach to a rear side of the substrate. For this reason, there is a problem that the conventional method causes oxidation on the rear side of the substrate.

SUMMARY OF THE INVENTION

An object of the present invention is to provide a substrate processing apparatus that efficiently and quickly introduce nitrogen so that an oxidation of a substrate can be prevented and in the same time, able to prevent turbulence in a flow of the inert gas.

To solve the aforesaid problem, a first aspect of the present invention is a substrate processing apparatus comprising, a plurality of lift pins causing the substrate to move up and down, a first lifting mechanism causing the plurality of lift pins to move up and down, a heating plate performing a heating process onto the substrate having a plurality of holes causing the plurality of lift pins to protrude and sink there-through to a surface facing the substrate, a lid having an inside portion and an outside portion being disposed above the heating plate so that the inside portion faces the heating plate and capable of moving up and down, a second lifting mechanism causing the lid to move up and down, a first inert gas introducing mechanism introducing a first inert gas to the inside portion of the lid, and a second inert gas introducing mechanism introducing a second inert gas onto the surface of the heating plate through the plurality of holes.

In such a structure, the inert gas can be introduced to both a surface and a rear side of the substrate, and oxygen is prevented from being forced to come around to the surface of the substrate from the rear side thereof. As a result, oxidation of the substrate can be prevented.

A substrate processing apparatus of the present invention further comprises a first controlling mechanism introducing the second inert gas onto the surface of the heating plate with using the second inert gas introducing mechanism while the first inert gas is being introduced into the inside portion of the lid with using the first inert gas introducing mechanism in a state that both the lid and the plurality of lift pins are lifted up.

In such a structure, the inert gas can be introduced to both the surface and the rear side of the substrate efficiently, when the substrate is being lifted up.

A substrate processing apparatus of the present invention further comprises, a first adjusting mechanism causing a temperature of the first and the second inert gas to be lower than a temperature of the substrate on the heating plate during the heating process.

In such a structure, the substrate is being exposed to the inert gas which temperature is lower than that of the heating plate during heating process before the substrate is placed on to the heating plate where the heating process is being performed, which greatly contributes to the prevention of oxidation of the substrate compared to a case when the heating process is being performed on the substrate without such exposure.

For example, the heating plate is to be heated in a range of 200° C. to 800° C. On the contrary the temperature of the inert gas is preferably, for example, equal to or higher than a room temperature and lower than 200° C., more preferably equal to or higher than a room temperature and lower than 150° C. When the temperature of the inert gas becomes above 200° C., the substrate is oxidized with an air that may be mixed into the inert gas caused by an effect of the high temperature. In addition, the oxidation is prevented more surely when the temperature is equal to 150° C. or lower.

The substrate processing apparatus of the present invention further comprises, a second controlling mechanism causing an amount of the first inert gas introduced into the inside portion of the lid to be larger than an amount of the second inert gas while the lid moves up and down.

In such a structure, the turbulence in a flow of the inert gas caused as the lid moves down can be prevented. In addition, the substrate is pushed down with the inert gas being introduced to the inside portion of the lid so that the substrate is prevented from shifting its position and/or rising from the lift pins. On the other hand, when the lid moves up, the balance between amount of gas introduced to the inside portion of the lid and the amount of gas introduced on to the surface of the heating plate can be maintained to a certain extent, enabling the substrate to be always surrounded with inert gas, which leads to the sure prevention of oxidation.

The substrate processing apparatus of the present invention further comprises, a pressure measuring portion measuring pressure in the inside portion of the lid, an exhaust mechanism exhausting the first inert gas in the inside portion of the lid and a second adjusting mechanism adjusting the amount of the first inert gas introduced into and exhausted from the inside portion of the lid with said exhausting mechanism according to the value measured with the pressure measuring portion, so that the pressure in the inside portion of the lid becomes constant.

In such a structure, the pressure in the inside portion of the lid is maintained to a predetermined value, for example, air pressure, as the gas is being exhausted with the gas exhausting mechanism. As a result, the turbulence in the flow of the gas can be prevented.

The substrate processing apparatus of the present invention further comprises, a third adjusting mechanism adjusting the amount of the first inert gas introduced into and exhausted from the inside portion of the lid with said exhaust mechanism just before the lid moves up and down from the heating plate, so that the pressure in the inside portion of the lid becomes higher than the atmospheric pressure.

In such a structure, not only an entry of an outer air is inhibited so that the substrate is prevented from being oxidized, but also an entry of a particle from outside is being prevented.

The substrate processing apparatus of the present invention further comprises, a third controlling mechanism causing a temperature of the second inert gas higher than a temperature of the first inert gas introduced into the inside portion of the lid and an upward and downward movement controlling mechanism causing the lid to move down so that a lower end of the lid becomes approximately the same level as a surface of the substrate while the plurality of lift pins move up holding the substrate, then causing the plurality of lift pins to move down simultaneously with the lid being positioned at approximately the same level as the surface of the substrate.

In such a structure, since the temperature of the second inert gas is higher, the second inert gas rises causing the inert gas that stays in the inside portion of the lid to rise at an outer periphery of the substrate. As a result, the inert gas tends to stay in the inside portion of the lid preventing the oxidation of the substrate more effectively. In addition, by moving down, for example, the lid and the substrate with having the lid being positioned at approximately the same level as the surface of the substrate, the lid can be closed with the low oxygen level is being maintained in the space above the surface of the substrate. As a result, the oxidation in the surface of the substrate can be prevented more effectively.

The substrate processing apparatus of the present invention further comprises, a gas guiding member being provided around the top end of at least one of the plurality of lift pins, being folded when the plurality of lift pins sink into the plurality of holes, and being unfolded when the lift pins protrude through the heating plate so that the second inert gas introduced through the plurality of holes is guided along the surface of the heating plate.

In such a structure, the inert gas can be introduced to the rear side of the substrate more effectively. In addition, the gas spouts out from the holes does not contact directly with the substrate and flows parallel to the surface of the substrate, preventing the substrate from being pushed up.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, embodiments of the present invention will be explained with reference to the drawings.

Figure 1:
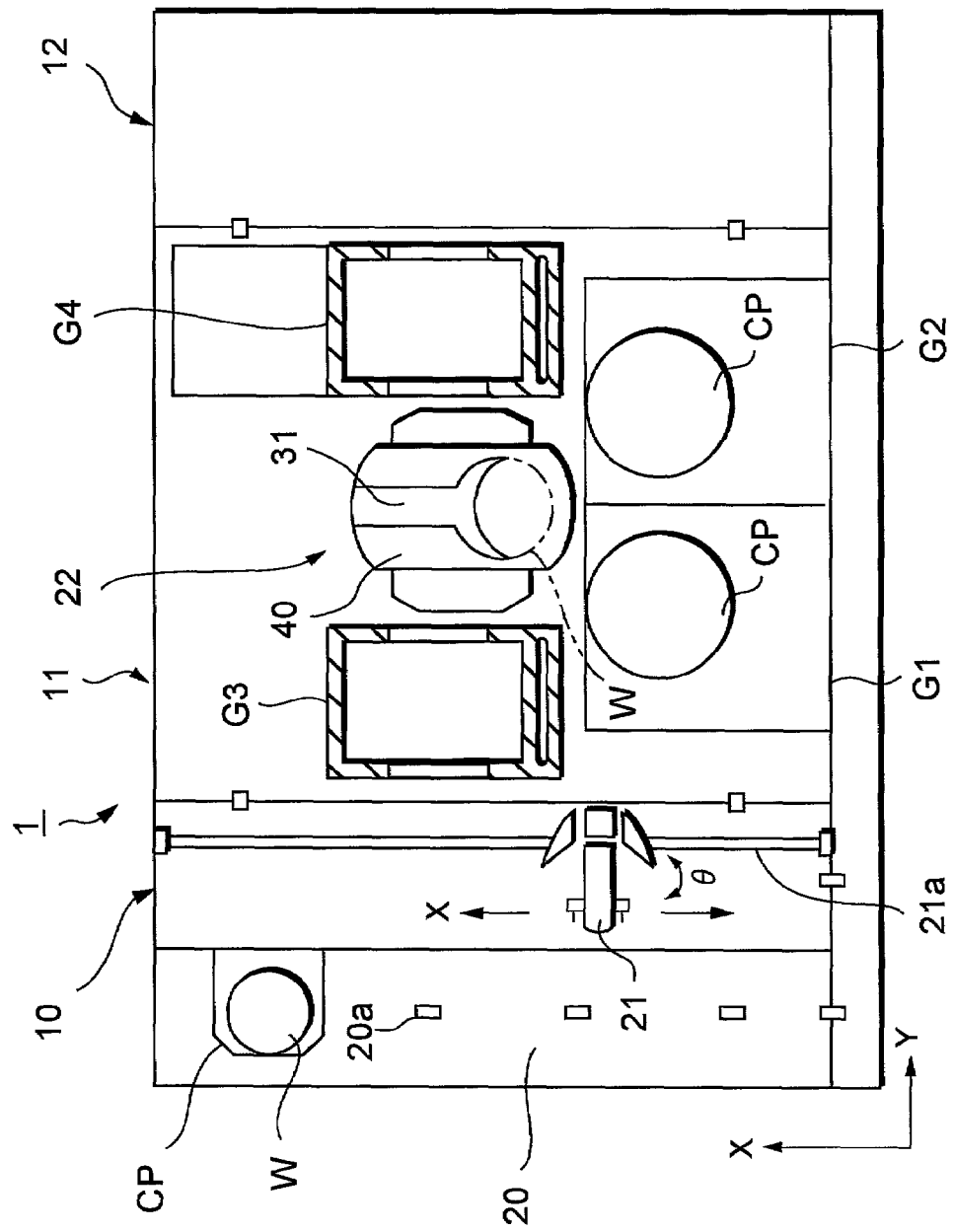
FIG. 1 is a plan view showing a total structure of a SOD system according to an embodiment of the present invention.
Figure 2:
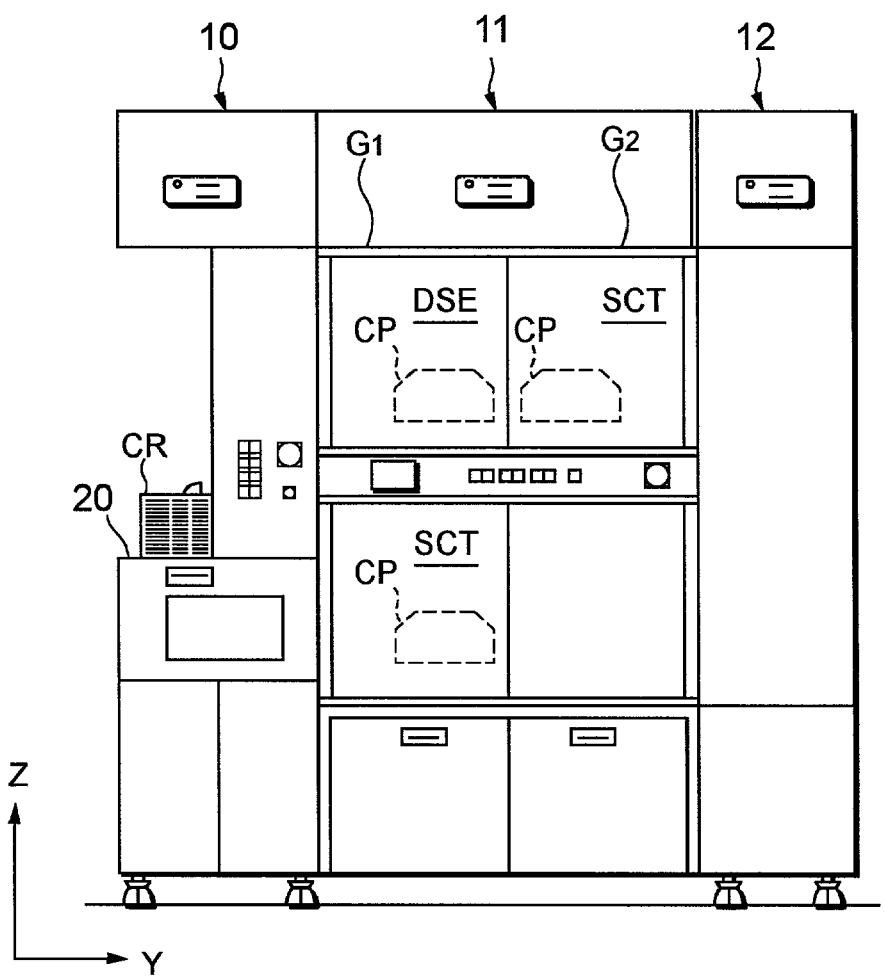
FIG. 2 is a front view of the SOD system shown in FIG. 1.
Figure 3:
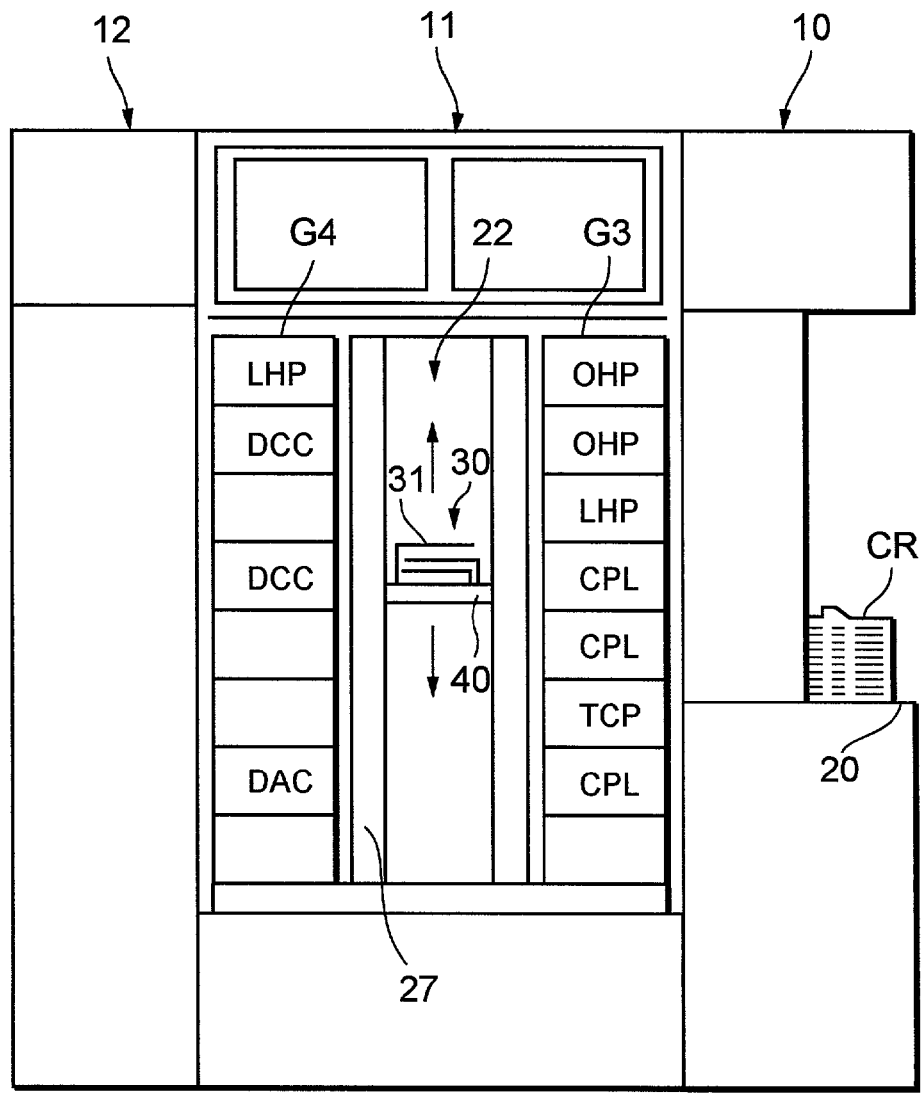
FIG. 3 is a back view of the SOD system shown in FIG. 1.

FIG. 1, FIG. 2 and FIG. 3 are diagrams showing a total configuration of SOD system according to an embodiment of the present invention. FIG. 1 is a plan view, FIG. 2 is a front view, and FIG. 3 is a rear view.

The SOD system 1 has a configuration in which, a cassette block 10 for carrying a plurality of semiconductor wafer W (hereinafter referred to as a "wafer"), for example, 25 wafer Ws, as a unit transferring into and out of the system and also into and out of the wafer cassette CR, a processing block 11 composed of various kinds of processing units multi-staged at predetermined positions for performing predetermined process for the wafer Ws one by one in SOD application steps, and a cabinet 12 disposing a bottle of ammonia water, a bubbler, a drain bottle and the like, necessary in an aging step, are integrally connected.

In the cassette block 10, as shown in FIG. 1, a plurality of, for example, up to four cassettes CR are placed in a line of an X-direction at positions of projections 20a provided for alignment thereof on a cassette mounting table 20, with respective outlet and inlet ports for the wafer W facing the processing block 11. A wafer transfer mechanism 21 movable in the direction of arrangement of the cassettes (an X-direction) and in the direction of arrangement of the wafers housed in the wafer cassette CR (a Z-vertical direction) is structured to be selectively accessible to each of the wafer cassettes CR. Further, the wafer transfer mechanism 21 is structured so that it can be rotated in θ-direction so as to be accessible to transfer and cooling plate portion (TCP) included in a multi-stage station portion of a third group G3 disposed at the processing block 11 side, as will be described later.

In the processing block 11, as shown in FIG. 1, a vertical carrier type of a main wafer transfer mechanism 22 is provided at a center, around which a group of or a plurality of groups of all processing stations are multi-staged. In this example, four processing groups G1, G2, G3 and G4 are disposed multi-staged. The multi-staged stations of the first and the second groups G1 and G2 are disposed on the front side of the system adjacent with each other (the front in FIG. 1). The multi-staged stations of the third group G3 is disposed adjacent to the cassette block 10 and the multi-staged unit of the fourth group G4 is disposed adjacent to the cabinet 12.

As shown in FIG. 2, in the first group G1, a SOD coating process station (SCT) and a solvent exchanging process station (DSE) are two-staged from the bottom in order. The SOD coating process station (SCT) supplies insulation film material while the wafer W is placed on a spin chuck in a cup CP and applies the insulation film on the wafer uniformly by spinning the wafer. The solvent exchanging process station (DSE) supplies chemicals for exchange like HMDS and heptane, exchanging a solvent in the coated isolation film with another solvent before the drying step with placing the wafer W onto a spin chuck in the cup CP.

In the second group G2, the SOD coating process station (SCT) is disposed on the upper stage. In addition, the SOD coating process station (SCT), the solvent exchanging process station (DSE) and the like can be disposed on the lower stage of the second group G2 as necessary.

As shown in FIG. 3, within the third group G3, two low oxygen high temperature heating process stations (OHP), a low temperature heating process station (LHP), two cooling process stations (CPL), a transfer and cooling plate portion (TCP) and a cooling process station (CPL) are multi-staged in sequence from the above. The low temperature heating process station (LHP) has a heating plate on which the wafer is placed and performs the low temperature heating process to the wafer W. The cooling process station (CPL) has a cooling plate on which the wafer W is placed and performs the cooling process to the wafer W. The transfer and cooling plate portion (TCP) is comprised of two stages, a cooling plate to cool the wafer W on the lower stage and a transferring table on the upper stage where transfer of the wafer W between the cassette block 10 and the processing block 11 takes place.

Within the fourth group G4, the low temperature heating process station (LHP), two low oxygen cure and cooling process stations (DCC), an aging process station (DAC) are multi-staged in sequence from the above. The low oxygen cure and cooling process station (DCC) has a heating plate and a cooling plate disposed next to each other in a processing chamber capable of being sealed hermetically and performs a heating process at a high temperature and also a cooling process on the wafer W after the heating process is being performed thereon, all in a low oxygen atmosphere of the oxygen being substituted with nitrogen. The aging process station (DAC) introduces NH3+H2O into the processing chamber capable of being sealed hermetically and performs the aging process on the wafer W, wet-gelling the insulation film material on the wafer W.

As shown in FIG. 3, a main wafer transfer mechanism 22 has a wafer transfer device 30 that is capable of moving up and down in vertical direction (the Z-direction) inside a cylindrical supporter 27. The cylindrical supporter 27 is connected to a rotating shaft of a motor (not shown) and rotates integrally with the wafer transfer device 30 around the aforesaid rotating shaft by a rotational driving force of the motor. Accordingly, the wafer transfer device 30 can be rotated in θ-direction. A transfer base 40 of the wafer transfer device 30 is provided with, for example, three forceps. These forceps 31 reach the processing stations disposed around the main wafer transfer mechanism 22 and transfer the wafer W between these processing stations.

Next, referring to FIG. 4 and FIG. 5, a configuration of a low oxygen high temperature heating process station (OHP) of the present invention will be described.

Figure 4:
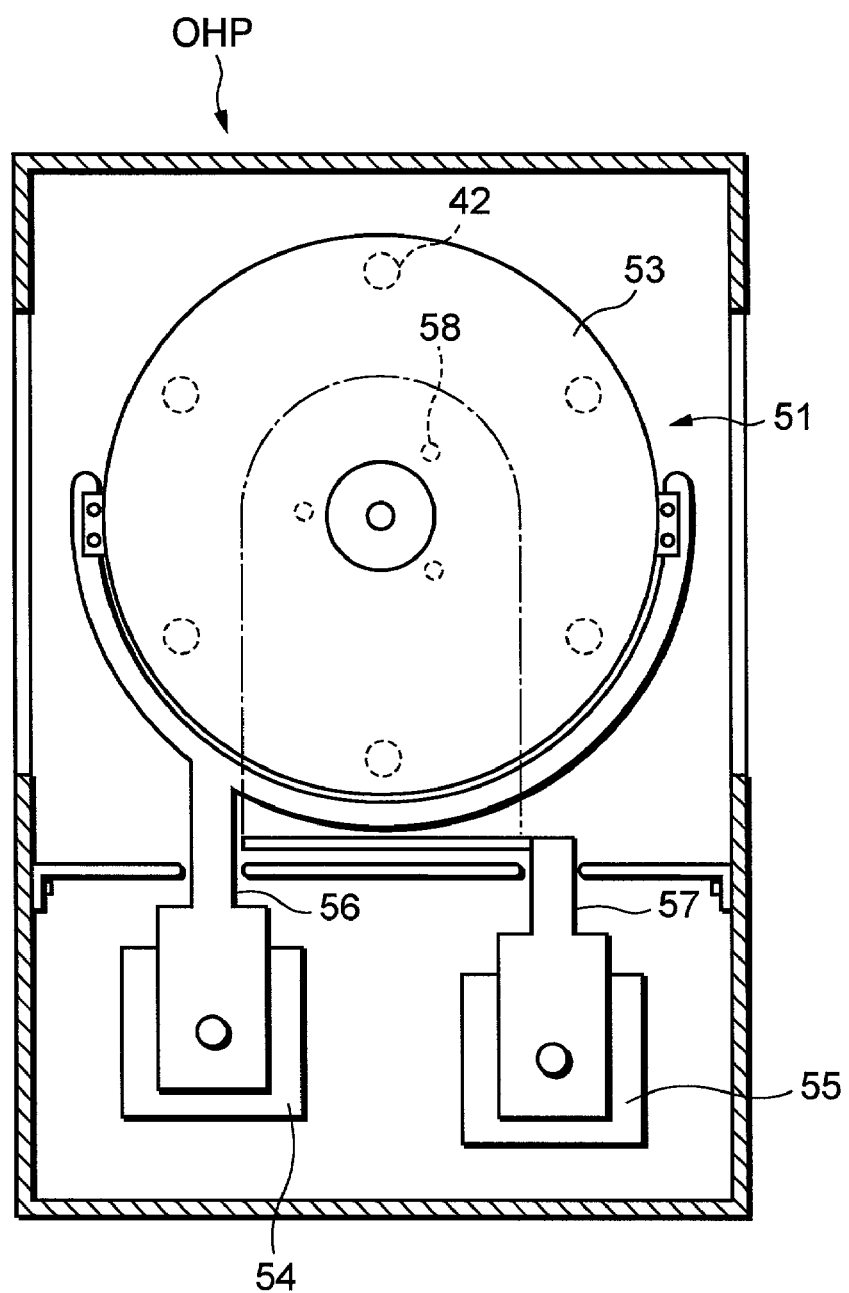
FIG. 4 is a plan view of a low oxygen high temperature heating process station (OHP) according to an embodiment of the present invention.
Figure 5:
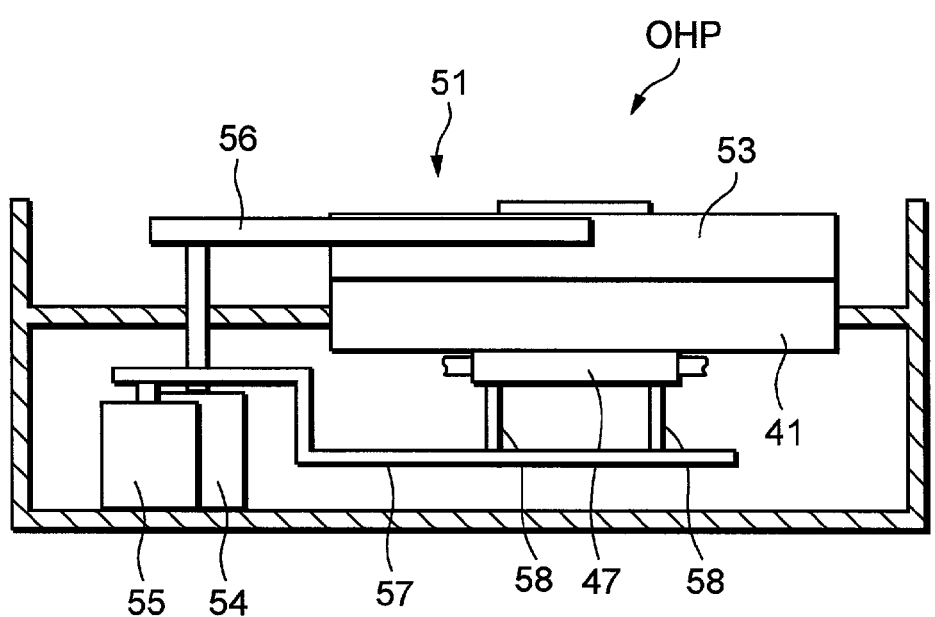
FIG. 5 is a sectional view of a low oxygen high temperature heating process station (OHP) shown in FIG. 4.

As shown in FIG. 4 and FIG. 5, a processing chamber 51 is disposed in the center of the low oxygen high temperature heating process station (OHP). The processing chamber 51 has a main body 41 and a lid 53 covering the body 41 that is capable of moving up and down. In addition, two cylinders 54 and 55, capable of moving up and down are disposed adjacent to the processing chamber 51. The cylinder 54 is connected to the lid 53 through a holding member 56 causing the lid 53 to move up and down. A heating chamber R is formed as the lid 53 touches the main body 41. On one hand, the cylinder 55 is connected to three lift pins 58, which will be described later, through a holding member 57 causing the lift pins 58 to move up and down.

Figure 6:
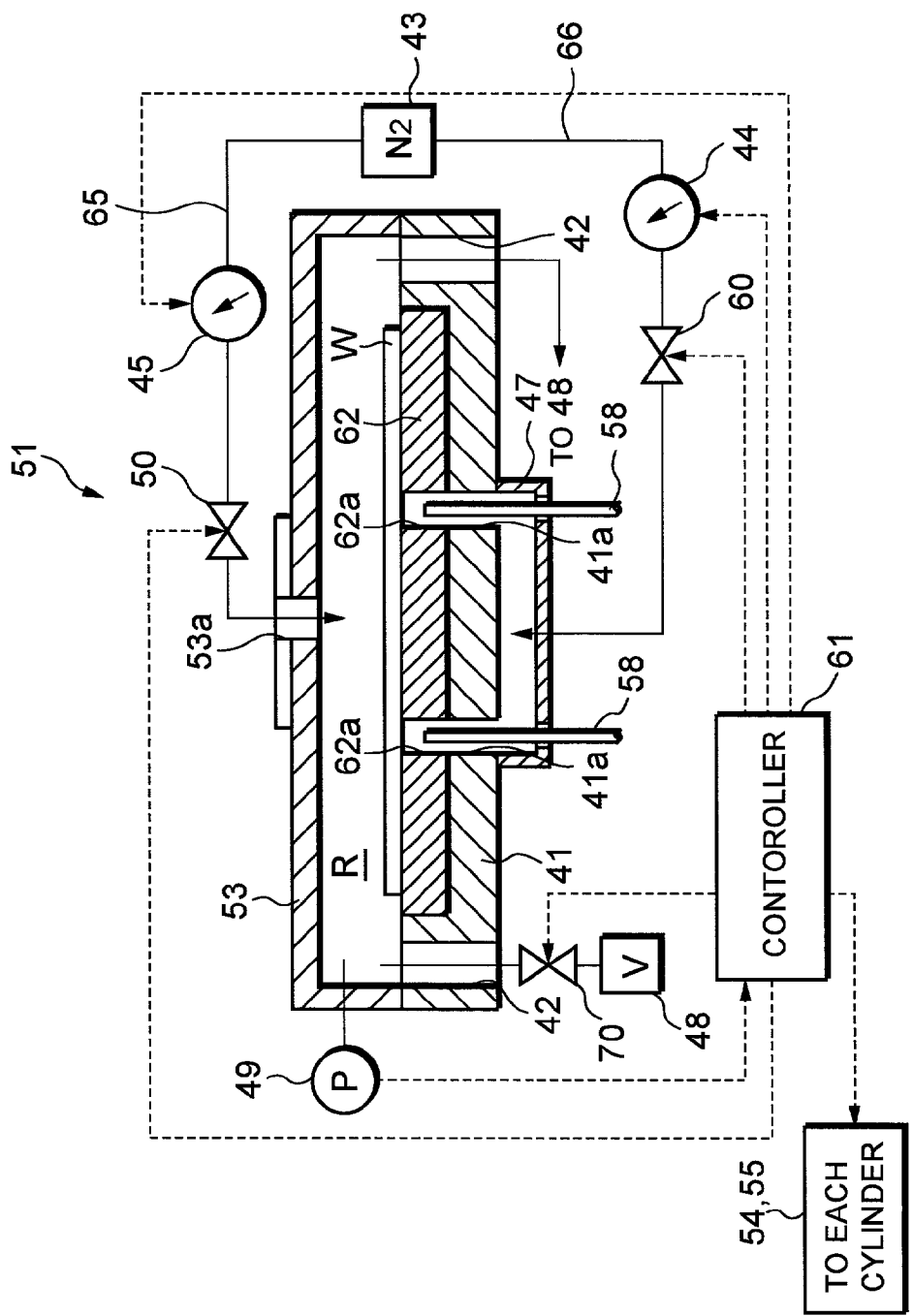
FIG. 6 is a sectional view of a processing chamber shown in FIG. 5.

As shown in FIG. 6, a heating plate 62 is disposed approximately the center of the main body 41. A heater (not shown) is provided in the hot plate 62. The heating plate 62 is to be heated, for example, up to 200° C. to 800° C. with the heater. In addition, a plurality of, for example, three holes 62a on a surface of the heating plate penetrate through to a rear side thereof. The lift pins 58 that are able to protrude and sink from the surface of the heating plate 62 are disposed to pass through each of the holes 62a. And the lift pins 58 transfer the wafer W to and from the main wafer transfer mechanism 22 while they are protruding from the surface of the heating plate 62. After receiving the wafer W from the main wafer transfer mechanism 22, the lift pins 58 move down and sink into the heating plate 62. As a result, the wafer W is placed on the heating plate 62 and the heating process is being performed thereon.

In addition, a plurality of, for example, six proximity sheets (not shown) for holding the wafer W above the heating plate 62 so that the wafer W does not contact the heating plate 62 are disposed on an outer peripheral portion of the mounting position of the wafer W on the surface of the heating plate 62.

A cover 47 provided for guiding nitrogen gas from the nitrogen supplier 43 to the surface of the heating plate 62 through the holes 62a and the holes 41a that are connected together and penetrates through the main body 41 is disposed on the rear side of the main body 41. In addition, a plurality of exhaust openings 42 to exhaust gas inside the heating chamber R is provided at an outer peripheral portion of the main body 41. These exhaust openings 42 are connected to a vacuum pump 48 and the gas inside the heating chamber R is exhausted through the exhaust valve 70.

A supply port 53a for supplying nitrogen from the nitrogen supplier is provided on the upper portion of the lid 53. Nitrogen supply from the nitrogen supplier 43 is performed through a supply pipe 65 and a first valve 50. Nitrogen supply to the heating chamber R through aforesaid holes 62a is performed through a supply pipe 66 and a second valve 60. The supply pipe 65 and 66 are provided with a first temperature regulator 45 and a second temperature regulator 44 respectively, each of them heating nitrogen to be supplied to the heating chamber R and controlling the temperature thereof.

A pressure gauge 49 is provided in the heating chamber R to measure the pressure inside. A valve lift opening of each of the valves 50, 60 and 70 are controlled by the controller 61 based on the measurement results of the pressure gauge 49, and so the pressure inside the heating chamber R can be controlled. In addition, the controller 61 controls each of the temperature regulators 45 and 44 when performing heating and temperature regulation. Furthermore, the controller 61 controls the movement of each cylinder 54 and 55.

Figure 7:
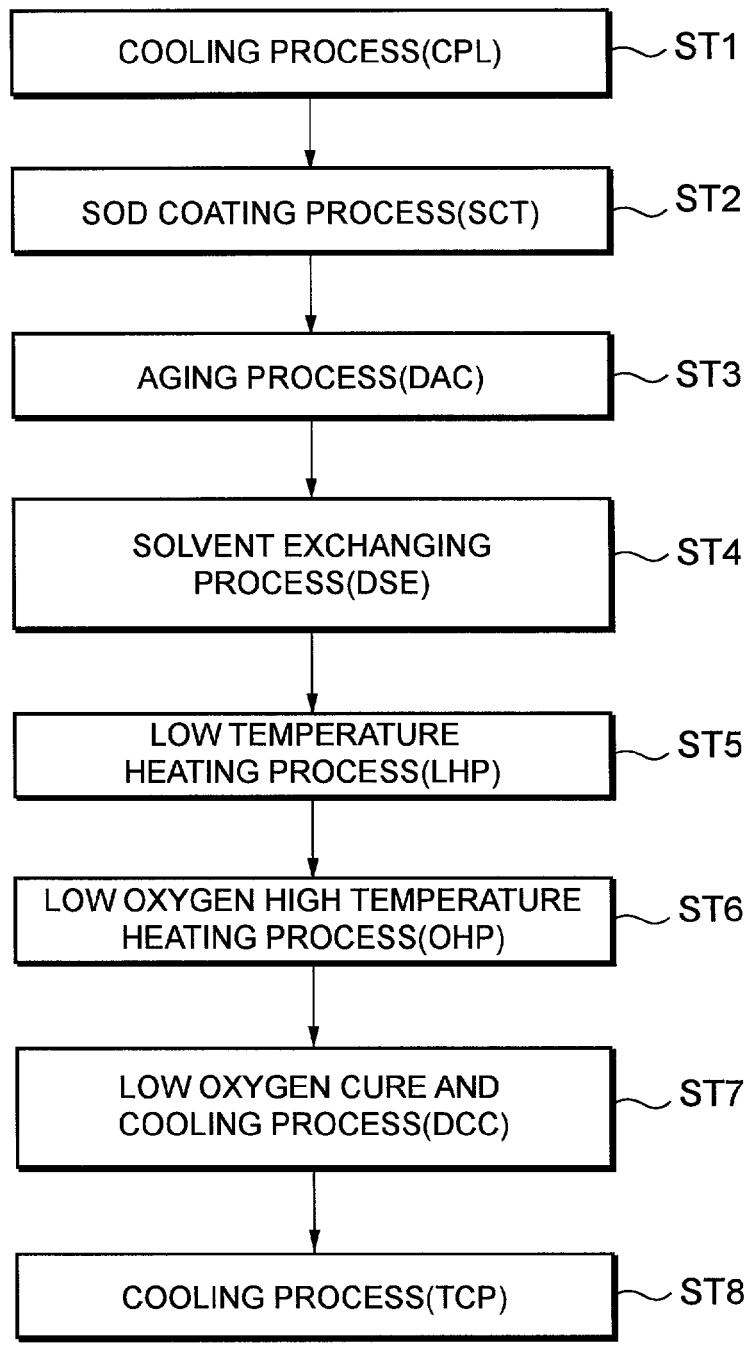
FIG. 7 is a flow chart showing the step in the SOD system of the present invention.

Next, a processing step of SOD system 1 is explained with reference to the flow chart shown in FIG. 7.

At first, in the cassette block 10, the wafer W before processing is transferred from the wafer cassette CR to the transfer table provided on the transfer and cooling plate portion (TCP) that belongs to the third group G3 in the processing block 11 side with a transfer mechanism 21.

The wafer W that is transferred to the transfer table on the transfer and cooling plate portion (TCP) is then transferred to the cooling process station (CPL) with the main wafer transfer mechanism 22. And in the cooling process station (CPL), the wafer W is cooled to a temperature appropriate for performing a coating process in the SOD coating process station (SCT) (Step 1).

After the cooling process is being performed in the cooling station (CPL), the wafer W is transferred to the SOD coating process station (SCT) with the main wafer transfer mechanism 22. And the SOD coating process is performed in the SOD coating process station (Step 2).

After the SOD coating process is being performed in the SOD coating process station (SCT), the wafer W is transferred to an aging process station (DAC) with the main wafer transfer mechanism 22. Then at the aging process station (DAC), the aging process is performed on the wafer with NH3+H2O being introduced into the processing chamber, and the insulation film material on the wafer W is being gelled (Step 3).

After the aging process is being performed in the aging process station (DAC), the wafer W is transferred to a solvent exchanging process station (DSE) with the main wafer transfer mechanism 22. In the solvent exchanging process station (DSE), the wafer W is supplied with a chemical for exchanging solvents and a process of exchanging the solvent in the isolation film coated on the wafer W with another solvent is being performed (Step 4).

After the exchanging process is being performed in the solvent exchanging process station (DSE), the wafer W is transferred to a low temperature heating process station (LHP) with the main transfer mechanism 22. And in the low temperature heating process station (LHP), the low temperature heating process is performed on the wafer W (Step 5).

After the low temperature heating process is being performed in the low temperature heating process station (LHP), the wafer W is transferred to the low oxygen high temperature heating process station (OHP) with the main wafer transfer mechanism 22 and a predetermined heating process is performed as will be described below (Step 6).

After the heating process is being performed in the low oxygen high temperature heating process station (OHP), the wafer W is transferred to the low oxygen cure and cooling process station (DCC) with the main wafer transfer mechanism 22. Then high temperature heating process and cooling process is performed on the wafer W in an atmosphere of low oxygen in the low oxygen cure and cooling process station (DCC) (Step 7).

After being processed in the low oxygen cure and cooling process station (DCC), the wafer W is transferred to the cooling plate on the transfer and cooling plate portion (TCP) with the main transfer mechanism 22. Then the cooling process is being performed on the wafer W at the cooling plate in the transfer and cooling plate portion (TCP) (Step 8).

After the cooling process is being performed on the wafer W at the cooling plate in the transfer and cooling plate portion (TCP), the wafer is transferred to the wafer cassette CR with the transfer mechanism 21.

Next, the effect in the low oxygen high temperature heating process station (OHP) in Step 6 will be described.

Figure 8:
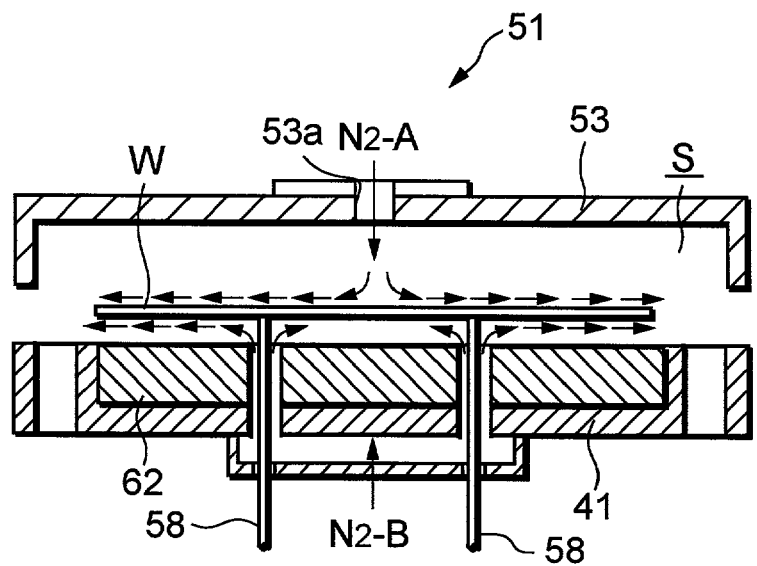
FIG. 8 is a sectional view showing the heating process in the first embodiment of the present invention.
Figure 12:
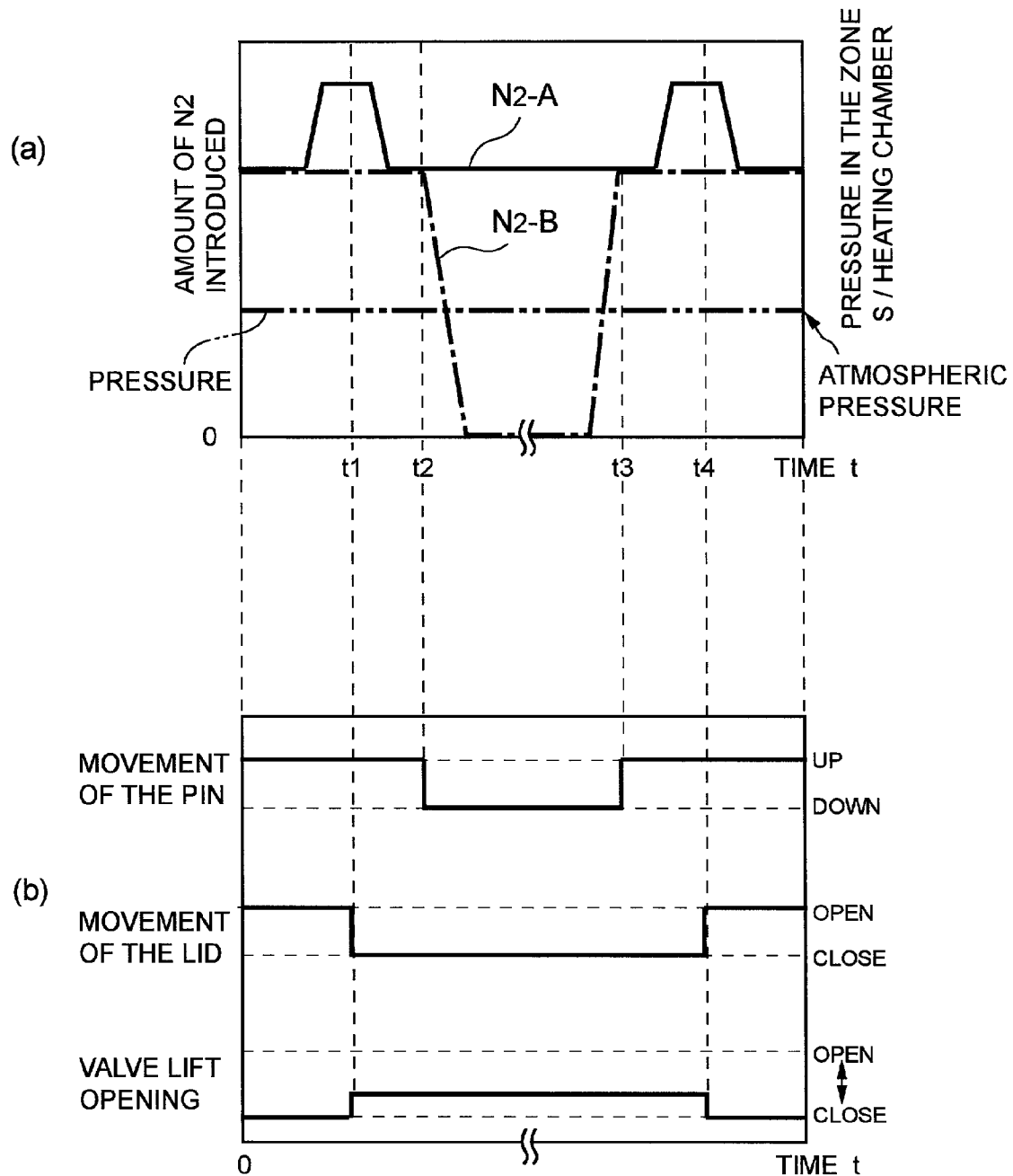
FIG. 12 is a diagram showing a relationship between a time disposed in a process and each processing condition in the heating process.

As shown in FIG. 8, the wafer W is transferred to the lift pins 58 from the main wafer transfer mechanism 22 while the lid 53 stays up. And nitrogen N2 (nitrogen introduced from the supply port 53a is herein after referred to as "N2-A") is being introduced from the supply port 53a of the lid 53 while the lift pins stay up in the same position, and approximately the same amount of nitrogen as N2-A (nitrogen introduced from the hole 62a is herein after referred to as "N2-B") is being introduced from the hole 62a of the heating plate 62. FIG. 12(a) is a diagram showing a relation between the processing time t and the amount of N2-A and N2-B being introduced in the zone S surrounded by the heating plate 62 and the lid 53 (the heating chamber R when the lid 53 is moved down and touches the main body) and the pressure inside the zone S (heating chamber R). In addition, FIG. 12(b) is a diagram showing a relationship between the processing time t and an up and down movement of the lift pins 58, an opening and closing movement of the lid 53, and a valve lift opening of the exhaust valve 70.

In the present embodiment, temperature of N2-A and N2-B is set to be the same by the first temperature regulator 45 and the second temperature regulator 44 respectively. The set temperature is to be lower than the temperature of the heating plate 62 performing heating process, for example, at 150° C. As explained, exposing the wafer W to the nitrogen which temperature is lower than that of the heating plate 62 before the Wafer W is placed thereon, greatly contributes to the prevention of oxidation of the substrate compared to a case when the heating process is being performed on the wafer W right after being transferred on the heating plate 62.

Figure 9:
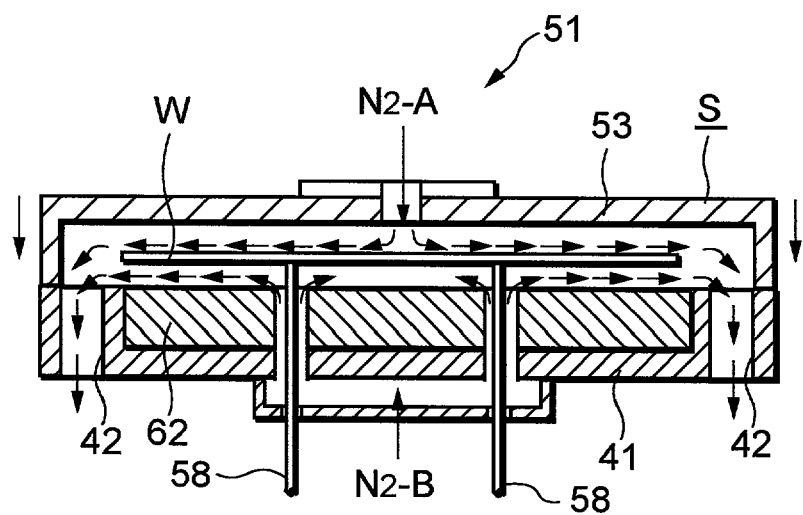
FIG. 9 is a sectional view showing an acting state of the heating process.

As shown in FIG. 9, while the lift pins stay up in the same position, the lid 53 moves down and heating chamber R is formed (time t1 in FIG. 12(a)). By having the amount of N2-A larger than N2-B, the turbulence in a flow of the inert gas in the zone S caused as the lid moves down can be prevented. In addition, the substrate is pushed down with the inert gas being introduced to the inside portion of the lid, so that the substrate is prevented from shifting its position and/or rising from the lift pins.

Figure 10:
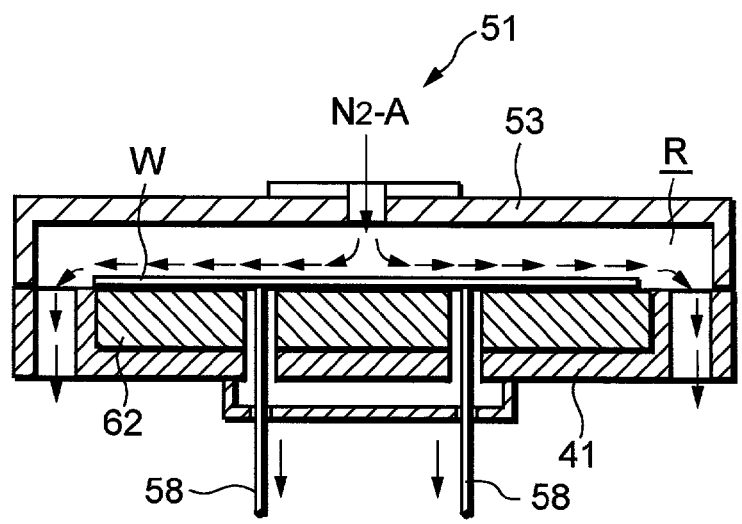
FIG. 10 is a sectional view showing an acting state of the heating process.

As shown in FIG. 10, the lift pins 58 are moved down at time t2 and the introduction of N2-B is stopped simultaneously while only N2-A is introduced in order to prevent oxidation of the wafer W. In the same time, with keeping the heating chamber R at the atmospheric pressure by an exhaust mechanism (exhaust from the exhaust opening 42), heating process is performed by the heating plate 62 for a predetermined time, for example, 10 minutes.

Figure 11:
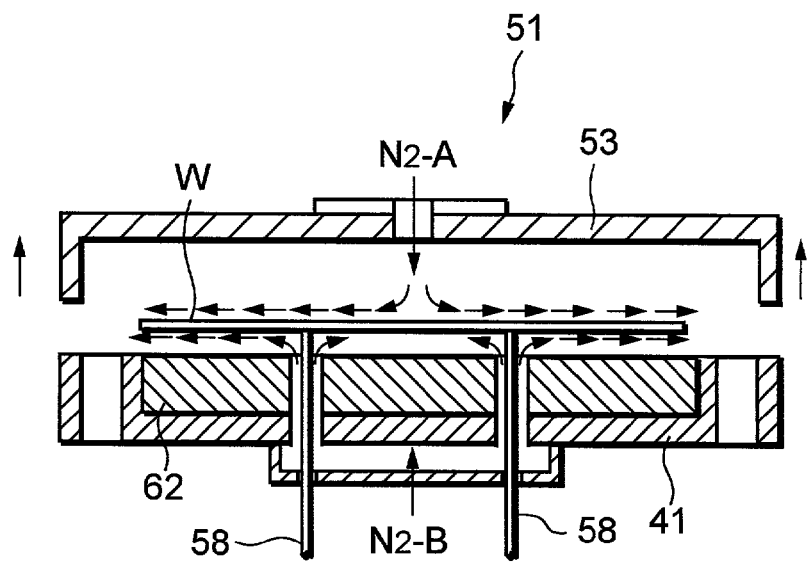
FIG. 11 is a sectional view showing an acting state of the heating process.

Then as shown in FIG. 11, after the heating process is performed for a predetermined time with the heating plate 62, the lift pins 58 are moved up and N2-B is introduced for approximately the same amount of N2-A (time t3) before the lid 53 is moved up. Then the lid 53 is moved up (time t4). With having the amount of N2-A larger than the amount of N2-B just before the lid 53 is moved up, the turbulence in a flow of the inert gas in the zone S caused as the lid 53 is moved up can be prevented. Also the wafer W is prevented from shifting its position and/or rising from the lift pins.

After that the wafer W is transferred to the main wafer transfer mechanism 22 from the lift pins 58.

In the present embodiment as described above, the oxidation of the rear side of the wafer W is prevented by introducing nitrogen not only on the surface of but also the rear side thereof. With this process, purging nitrogen can be performed efficiently.

In addition, gas flow can be stabilized with controlling the amount of N2-A and N2-B while the lid 53 is moved up, and also with controlling the amount of N2-A and the exhausted amount of gas during heating process performed with the heating plate 62.

Figure 13:
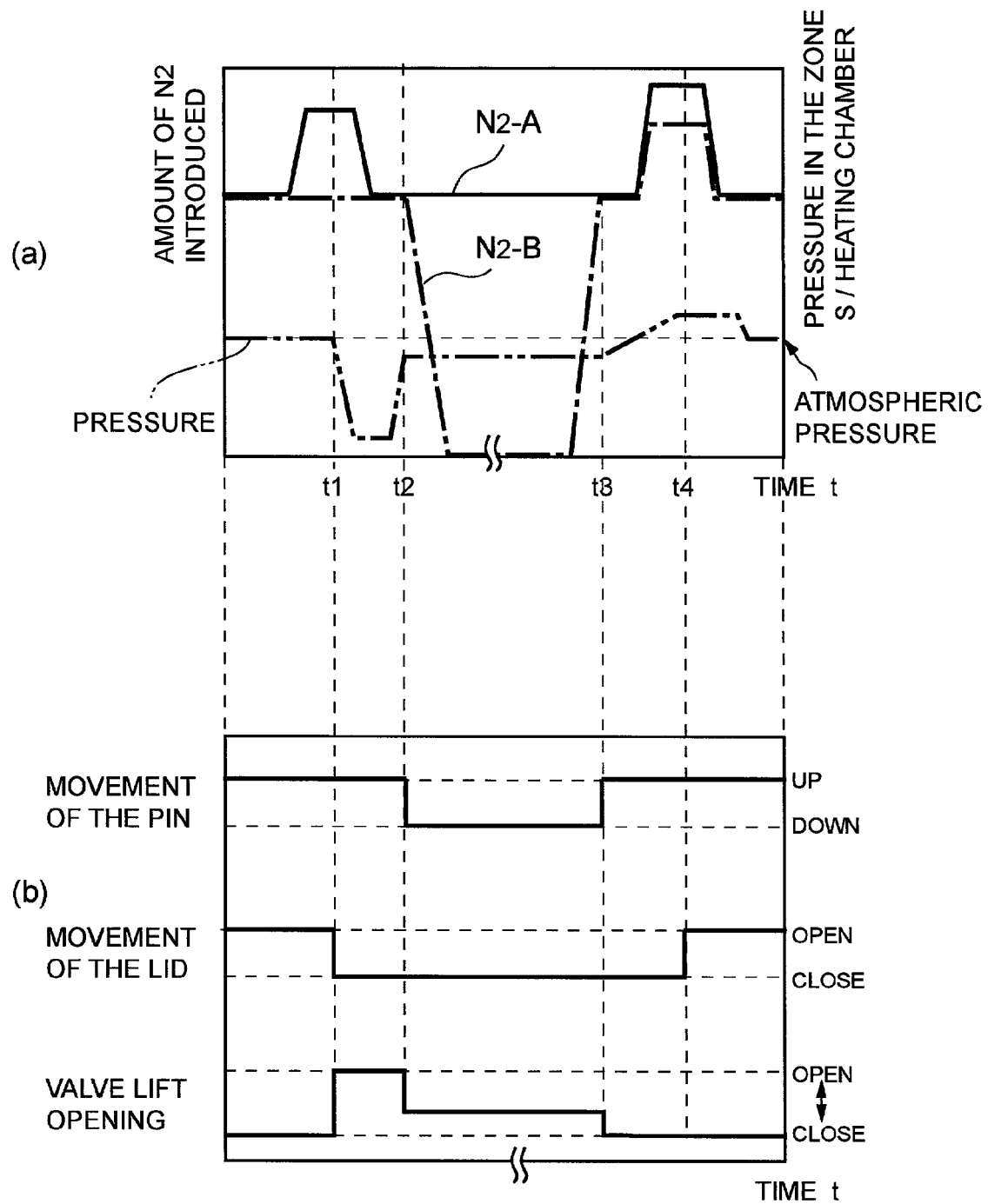
FIG. 13 is a diagram showing a relationship between a time disposed in a process and each processing condition in the heating process according to the second embodiment of the present invention.

Next, heating process of the second embodiment is described with reference to FIG. 13.

The wafer W is transferred to the lift pins 58 from the main wafer transfer mechanism 22 while the lid 53 is moved up. Then N2-A and N2-B are being introduced for approximately the same amount while the lift pins stay up in the same position.

In the present embodiment, temperature of nitrogen N2-A and N2-B are set to be the same with the first temperature regulator 45 and the second temperature regulator 44, respectively. The set temperature is lower than the temperature of the heating plate 62 on which the heating process is about to be performed, for example 150° C. Because a heating process is performed at the temperature lower than that of the heating plate 62 before the wafer is heat-processed on the heating plate 62, the process, same as the embodiment described above, contributes to the prevention of oxidation of the wafer W.

Then with the pins staying up in the same position, the lid 53 is moved down forming the heating chamber R (time t1). With having the amount of N2-A larger than the amount of N2-B just before the lid 53 is moved down, the turbulence in a flow of the inert gas in the zone S caused as the lid 53 is moved down can be prevented. Also the wafer W is prevented from shifting its position and/or rising from the lift pins.

After the heating chamber R is formed, valve lift opening of the exhaust valve 70 is maximized, and the heating chamber R is kept in reduced pressure state, for example, at 400 Pa to 1000 Pa. With this process, nitrogen can be purged quickly by removing oxygen from the heating chamber R and introducing N2-A and N2-B in the reduced pressure state.

The lift pins 58 are moved down at time t2 and the introduction of N2-B is stopped simultaneously while only N2-A is introduced in order to prevent oxidation of the wafer W. In the same time, the heating process is performed with the heating plate 62 for a predetermined time, for example, 10 minutes with keeping the pressure of the heating chamber R, for example, little less than the atmospheric pressure by reducing the valve lift opening of the exhaust valve.

When the heating process is finished for a predetermined time by the heating plate 62, the lift pins 58 are moved up before the lid 53 is moved up and approximately the same amount of N2-B as N2-A is introduced (time t3). Then the lid 53 is moved up (time t4). With having the amount of N2-A larger than the amount of N2-B just before the lid 53 is moved up, the turbulence in a flow of the inert gas in the zone S caused as the lid 53 is moved up can be prevented. Also the wafer W is prevented from shifting its position and/or rising from the lift pins. In addition, the amount of exhaustion of N2-A and N2-B is adjusted so that the pressure in the heating chamber R becomes slightly higher than the atmospheric pressure just before the lid 53 is moved up. With this process, not only an inflow of outer air into the zone S and oxidation of a substrate can be prevented but also an inflow of particles from outside can be restrained. In this case, in order to prevent turbulence to occur, for example, the exhaust valve 70 may be closed slowly.

Next, the third embodiment is described with reference to FIG. 14.

Figure 14A:
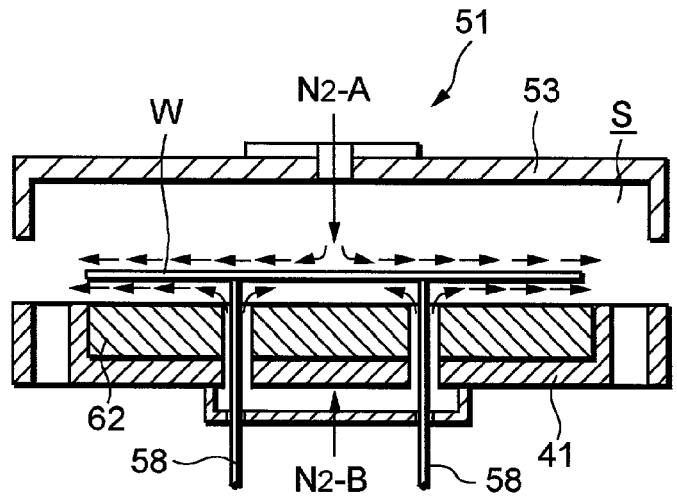
FIG. 14A to FIG. 14C are sectional views showing an acting state of the heating process according to the third embodiment of the present invention.

As shown in FIG. 14(a), the wafer W is transferred to the lift pins 58 from the main wafer transfer mechanism 22 while the lid 53 is moved up. N2-A and N2-B are being introduced for approximately the same amount while the pins stay up in the same position.

Figure 14B:
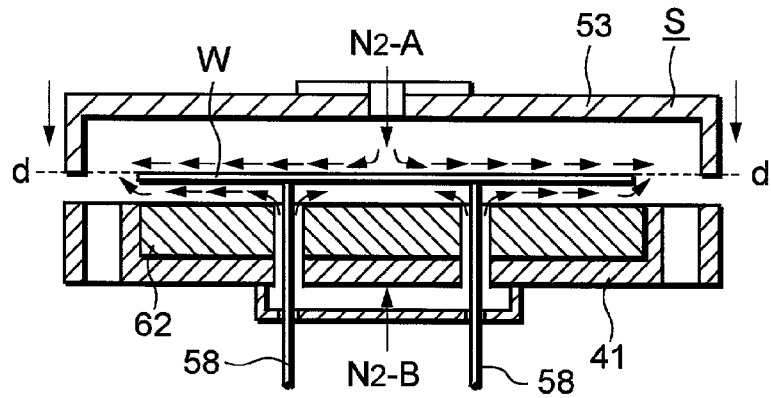

As shown in FIG. 14(b), a lower end of the lid 53 is moved down to the same level of the surface of the wafer W, to the level "d". The temperature of nitrogen N2-B is set to be higher than the temperature of nitrogen of N2-A. In other words, temperature of nitrogen staying in the surface of the heating plate 62 is set to be higher than the temperature of nitrogen staying inside portion of the lid 53.

Figure 14C:
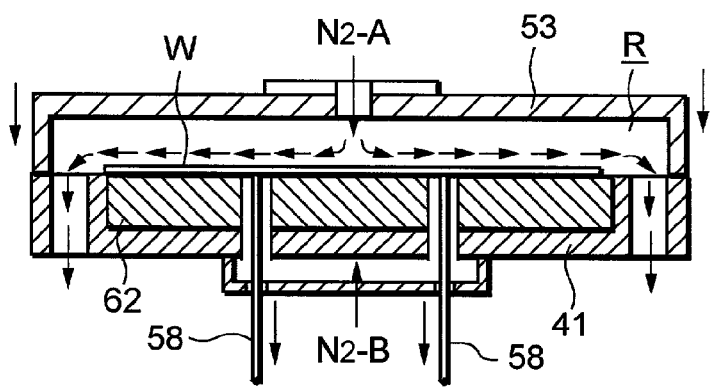

As shown in FIG. 14(c), while the level of the lower end of the lid 53 and the surface of the wafer W are being kept the same, the lid 53 and the lift pins 58 are moved down with the same speed, forming the heating chamber R.

As thus being described, with having the temperature of N2-B high, the N2-B pushes nitrogen N2-A staying inside portion of the lid 53 up from rear side of the wafer W at the outer periphery thereof. Therefore N2-A tends to stay at an upper side rather than near the surface of the wafer W, resulting in improved efficiency in the prevention of oxidation of the wafer W. Furthermore, by moving down both the wafer W and the lid 53 with keeping the lower end of the lid 53 the same level as the surface of the wafer W, the lid 53 can be closed with low oxygen state is being kept in the upper side from the surface of the wafer W. For this reason, oxidation of the wafer W can be prevented more efficiently.

After that, with performing the heating process with various conditions being the same as the first embodiment and the second embodiment, the same effect as the first and the second embodiment can be obtained regarding the prevention of oxidation of the wafer W and the turbulence in a flow of the inert gas.

Figure 15:
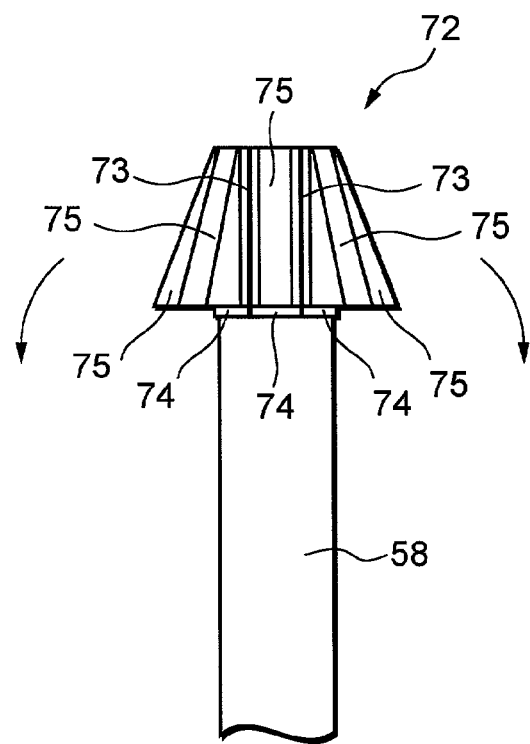
FIG. 15 is a side view showing another embodiment of a lift pin.
Figure 16:
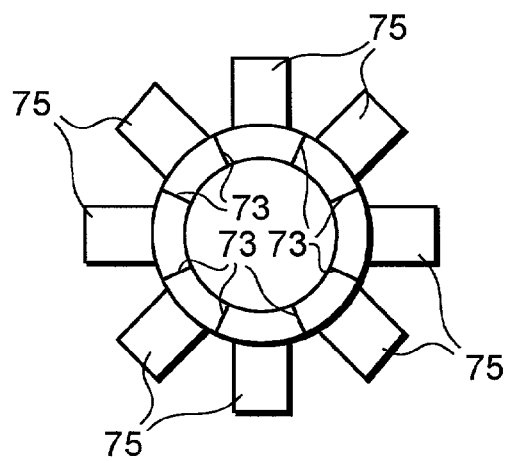
FIG. 16 is a plan view of the lift pin shown in FIG. 15.

FIG. 15 and FIG. 16 are a front view and a plan view showing other embodiment of the lift pins 58.

The lift pins 58 of the present embodiment have a guiding member at top end portion in order to introduce N2-B from the holes 62a of the heating plate 62 efficiently to the rear side of the wafer W. The guiding member 72 is provided with a plurality of slits 73 provided at end portion of the lift pins 58 and a plurality of, for example, eight triangular shaped fins 75 are disposed between the plurality of slits 73. Each of the fins 75 is structured to be capable of flapping downward by 90° having a holding portion 74 as an axis.

Figure 17:
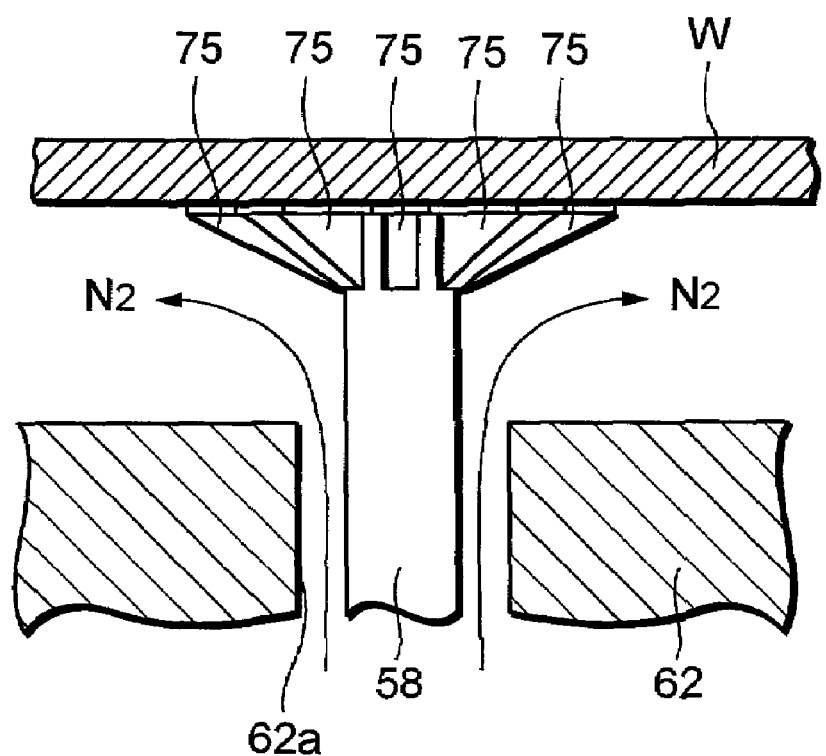
FIG. 17 is a sectional view showing an acting state of a guiding member of the lift pin.

The guiding member 72 is folded as shown in FIGS. 15 and 16 when the lift pins 58 are down and being sunk into the holes 62a of the heating plate 62. Then when the guiding member 72 holds the wafer W, the fins 75 flap downward as shown in FIG. 17. With this configuration, nitrogen can be spread to all of the rear side of the wafer W quickly and effectively.

In addition, the present invention is not limited to an embodiment as described above, however, various kinds of modification is possible.

In the second embodiment, the pressure in the zone S is controlled to be higher than the atmospheric pressure only when the heating process of the wafer W with the heating plate 62 is finished and when the lid 53 is moving up, however, for example, the process can be performed when the lid 53 is moving down before the heating process is started. The process can also be applied to the first embodiment.

In addition, for example, in each of the embodiments described above, nitrogen introduction from the holes 62a of the heating plate 62 is performed only when the lift pins are moving up. As described above, heating process of the wafer W with the heating plate 62 is performed without having the wafer W contact with the heating plate 62 by using the proximity sheets, therefore, oxidation of the wafer W at time of heating can be prevented with introducing nitrogen into the zone between the heating plate 62 and the wafer W.

In addition, the application of each of the embodiments described above is not limited to the low oxygen high temperature heating process station (OHP), however, the embodiments can also be applied to the low oxygen high temperature heating and cooling process station (DCC).

Furthermore, each of the embodiments described above is not limited to the application to a heating apparatus for processing a semiconductor substrate, however, the present invention can also be applied to a heating apparatus for processing a glass substrate used in liquid crystal display.

As explained above, the present invention enables the prevention of the oxidation of the substrate and turbulence in a flow of the inert gas by introducing nitrogen quickly and efficiently.

The disclosure of Japanese Patent Application No.2001-052799 filed Feb. 27, 2001 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. An apparatus for processing a substrate, comprising:
a plurality of lift pins that cause the substrate to move up and down;
a first lifting mechanism that causes the plurality of lift pins to move up and down;
a heating plate which performs a heating process on the substrate, having a plurality of holes allowing the plurality of lift pins to protrude and sink there-through to a surface facing the substrate;
a lid having an inside portion and an outside portion, being disposed above the heating plate so that the inside portion faces the heating plate, and capable of moving up and down;
a second lifting mechanism that causes the lid to move up and down;
a first inert gas introducing mechanism that introduces a first inert gas to the inside portion of the lid;
a second inert gas introducing mechanism that introduces a second inert gas onto the surface of the heating plate through the plurality of holes; and
a first controlling mechanism that introduces the second inert gas onto the surface of the heating plate using the second inert gas introducing mechanism while the first inert gas is being introduced into the inside portion of the lid using the first inert gas introducing mechanism in a state that both the lid and the plurality of lift pins are lifted up.

2. The apparatus as set forth in claim 1, further comprising:
a first adjusting mechanism that causes a temperature of the first and the second inert gas to be lower than that of the substrate on the heating plate during the heating process.

3. The apparatus as set forth in claim 1, further comprising:
a second controlling mechanism that causes an amount of the first gas introduced into the inside portion of the lid to be larger than that of the second inert gas while the lid moves up and down.

4. The apparatus as set forth in claim 1, further comprising:
a pressure measuring portion that measures pressure in the inside portion of the lid;
an exhaust mechanism that exhausts the first inert gas in the inside portion of the lid; and
a second adjusting mechanism that adjusts the amount of the first inert gas introduced into and exhausted from the inside portion of the lid according to the value measured with the pressure measuring portion, so that the pressure in the inside portion of the lid becomes constant.

5. The apparatus as set forth in claim 4, further comprising:
a third adjusting mechanism that adjusts the amount of the first inert gas introduced into and exhausted from the inside portion of the lid just before the lid moves up and down from the heating plate, so that the pressure in the inside portion of the lid becomes higher than an atmospheric pressure.

6. The apparatus as set forth in claim 5, further comprising:
a third controlling mechanism that causes a temperature of the second inert gas to be higher than that of the first inert gas introduced into the inside portion of the lid; and
an upward and downward movement controlling mechanism that causes the lid to move down so that a lower end of the lid becomes approximately the same level as a surface of the substrate while the plurality of lift pins move up holding the substrate, then causes the plurality of lift pins to move down simultaneously with the lid being positioned at approximately the same level as the surface of the substrate.

7. The apparatus as set forth in claim 6, further comprising:
a gas guiding member being provided around the top end of at least one of the plurality of lift pins, being folded when the plurality of lift pins sink into the plurality of holes, and being unfolded when the lift pins protrude through the heating plate so that the second inert gas introduced through the plurality of holes is guided along the surface of the heating plate.

8. An apparatus for processing a substrate, comprising:
a plurality of lift pins that cause the substrate to move up and down;
a first lifting mechanism that causes the plurality of lift pins to move up and down;

a heating plate which performs a heating process on the substrate, having a plurality of holes allowing the plurality of lift pins to protrude and sink there-through to a surface facing the substrate;

a lid having an inside portion and an outside portion, being disposed above the heating plate so that the inside portion faces the heating plate, and capable of moving up and down;

a second lifting mechanism that causes the lid to move up and down;

a first inert gas introducing mechanism that introduces a first inert gas to the inside portion of the lid;

a second inert gas introducing mechanism that introduces a second inert gas onto the surface of the heating plate through the plurality of holes; and a first adjusting mechanism that causes a temperature of the first and the second inert gas to be lower than that of the substrate on the heating plate during the heating process.

9. The apparatus as set forth in claim 8, further comprising:

a second controlling mechanism that causes an amount of the first inert gas introduced into the inside portion of the lid to be larger than that of the second inert gas while the lid moves up and down.

10. The apparatus as set forth in claim 8, further comprising:

a pressure measuring portion that measures pressure in the inside portion of the lid;

an exhaust mechanism that exhausts the first inert gas in the inside portion of the lid; and a second adjusting mechanism that adjusts the amount of the first inert gas introduced into and exhausted from the inside portion of the lid according to the value measured with the pressure measuring portion, so that the pressure in the inside portion of the lid becomes constant.

11. The apparatus as set forth in claim 10, further comprising:

a third adjusting mechanism that adjusts the amount of the first inert gas introduced into and exhausted from the inside portion of the lid just before the lid moves up and down from the heating plate, so that the pressure in the inside portion of the lid becomes higher than an atmospheric pressure.

12. The apparatus as set forth in claim 11, further comprising:

a third controlling mechanism that causes a temperature of the second inert gas to be higher than that of the first inert gas introduced into the inside portion of the lid; and an upward and downward movement controlling mechanism that causes the lid to move down so that a lower end of the lid becomes approximately the same level as a surface of the substrate while the plurality of lift pins move up holding the substrate, then causes the plurality of lift pins to move down simultaneously with the lid being positioned at approximately the same level as the surface of the substrate.

13. The apparatus as set forth in claim 12, further comprising:

a gas guiding member being provided around the top end of at least one of the plurality of lift pins, being folded when the plurality of lift pins sink into the plurality of holes, and being unfolded when the lift pins protrude through the heating plate so that the second inert gas introduced through the plurality of holes is guided along the surface of the heating plate.

14. An apparatus for processing a substrate, comprising:

a plurality of lift pins that cause the substrate to move up and down;

a first lifting mechanism that causes the plurality of lift pins to move up and down;

a heating plate which performs a heating process on the substrate, having a plurality of holes allowing the plurality of lift pins to protrude and sink there-through to a surface facing the substrate;

a lid having an inside portion and an outside portion, being disposed above the heating plate so that the inside portion faces the heating plate, and capable of moving up and down;

a second lifting mechanism that causes the lid to move up and down;

a first inert gas introducing mechanism that introduces a first inert gas to the inside portion of the lid;

a second inert gas introducing mechanism that introduces a second inert gas onto the surface of the heating plate through the plurality of holes; and a second controlling mechanism that causes an amount of the first inert gas introduced into the inside portion of the lid to be larger than that of the second inert gas while the lid moves up and down.

15. The apparatus as set forth in claim 14, further comprising:

a pressure measuring portion that measures pressure in the inside portion of the lid;

an exhaust mechanism that exhausts the first inert gas in the inside portion of the lid; and a second adjusting mechanism that adjusts the amount of the first inert gas introduced into and exhausted from the inside portion of the lid according to the value measured with the pressure measuring portion, so that the pressure in the inside portion of the lid becomes constant.

16. The apparatus as set forth in claim 15, further comprising:

a third adjusting mechanism that adjusts the amount of the first inert gas introduced into and exhausted from the inside portion of the lid just before the lid moves up and down from the heating plate, so that the pressure in the inside portion of the lid becomes higher than an atmospheric pressure.

17. The apparatus as set forth in claim 16, further comprising:

a third controlling mechanism that causes a temperature of the second inert gas to be higher than that of the first inert gas introduced into the inside portion of the lid; and an upward and downward movement controlling mechanism that causes the lid to move down so that a lower end of the lid becomes approximately the same level as a surface of the substrate while the plurality of lift pins move up holding the substrate, then causes the plurality of lift pins to move down simultaneously with the lid being positioned at approximately the same level as the surface of the substrate.

18. The apparatus as set forth in claim 17, further comprising:

a gas guiding member being provided around the top end of at least one of the plurality of lift pins, being folded when the plurality of lift pins sink into the plurality of holes, and being unfolded when the lift pins protrude through the heating plate so that the second inert gas introduced through the plurality of holes is guided along the surface of the heating plate.

19. An apparatus for processing a substrate, comprising:

a plurality of lift pins that cause the substrate to move up and down;

a first lifting mechanism that causes the plurality of lift pins to move up and down;

a heating plate which performs a heating process on the substrate, having a plurality of holes allowing the plurality of lift pins to protrude and sink there-through to a surface facing the substrate;

a lid having an inside portion and an outside portion, being disposed above the heating plate so that the inside portion faces the heating plate, and capable of moving up and down;

a second lifting mechanism that causes the lid to move up and down;

a first inert gas introducing mechanism that introduces a first inert gas to the inside portion of the lid;

a second inert gas introducing mechanism that introduces a second inert gas onto the surface of the heating plate through the plurality of holes;

a pressure measuring portion that measures pressure in the inside portion of the lid;

an exhaust mechanism that exhausts the first inert gas in the inside portion of the lid; and a second adjusting mechanism that adjusts the amount of the first inert gas introduced into and exhausted from the inside portion of the lid according to the value measured with the pressure measuring portion, so that the pressure in the inside portion of the lid becomes constant.

20. The apparatus as set forth in claim 19, further comprising:

a third adjusting mechanism that adjusts the amount of the first inert gas introduced into and exhausted from the inside portion of the lid just before the lid moves up and down from the heating plate, so that the pressure in the inside portion of the lid becomes higher than an atmospheric pressure.

21. The apparatus as set forth in claim 20, further comprising:

a third controlling mechanism that causes a temperature of the second inert gas to be higher than that of the first inert gas introduced into the inside portion of the lid; and an upward and downward movement controlling mechanism that causes the lid to move down so that a lower end of the lid becomes approximately the same level as a surface of the substrate while the plurality of lift pins move up holding the substrate, then causes the plurality of lift pins to move down simultaneously with the lid being positioned at approximately the same level as the surface of the substrate.

22. The apparatus as set forth in claim 21, further comprising:

a gas guiding member being provided around the top end of at least one of the plurality of lift pins, being folded when the plurality of lift pins sink into the plurality of holes, and being unfolded when the lift pins protrude through the heating plate so that the second inert gas introduced through the plurality of holes is guided along the surface of the heating plate.

* * * * *